(12) United States Patent
Ge

(10) Patent No.: US 12,198,761 B2
(45) Date of Patent: Jan. 14, 2025

(54) CROSSBAR ARRAY WITH REDUCED DISTURBANCE

(71) Applicant: TetraMem Inc., Fremont, CA (US)

(72) Inventor: Ning Ge, Danville, CA (US)

(73) Assignee: TetraMem Inc., Fremont, CA (US)

( * ) Notice: Subject to any disclaimer, the term of this patent is extended or adjusted under 35 U.S.C. 154(b) by 0 days.

(21) Appl. No.: 18/060,420

(22) Filed: Nov. 30, 2022

(65) Prior Publication Data

US 2023/0102234 A1 Mar. 30, 2023

Related U.S. Application Data

(62) Division of application No. 15/999,140, filed on Aug. 17, 2018, now Pat. No. 11,538,523.

(51) Int. Cl.
*G11C 11/15* (2006.01)
*G11C 13/00* (2006.01)
*G11C 16/34* (2006.01)

(52) U.S. Cl.
CPC ........ *G11C 13/0069* (2013.01); *G11C 13/003* (2013.01); *G11C 13/0033* (2013.01); *G11C 16/3427* (2013.01); *G11C 2013/0071* (2013.01); *G11C 2213/71* (2013.01); *G11C 2213/79* (2013.01)

(58) Field of Classification Search
CPC ...................................... G11C 11/15
See application file for complete search history.

(56) References Cited

U.S. PATENT DOCUMENTS

| 2004/0012995 A1* | 1/2004 | Ishikawa ................ G11C 11/15 365/158 |
| 2005/0041465 A1 | 2/2005 | Rueckes et al. |
| 2005/0211978 A1 | 9/2005 | Bu et al. |
| 2009/0273971 A1 | 11/2009 | Schepens |

FOREIGN PATENT DOCUMENTS

| CN | 1469383 A | 1/2004 |
| EP | 2626903 A1 | 8/2013 |
| JP | 2017182848 A | 10/2017 |

* cited by examiner

*Primary Examiner* — Jason Lappas
(74) *Attorney, Agent, or Firm* — Jaffery Watson Hamilton & DeSanctis LLP

(57) ABSTRACT

The present application provides methods for programming a circuit device with reduced disturbances. The methods may include: selecting a first target device on a target row of a plurality of rows and a target column of a plurality of columns; selecting the target row; connecting the plurality of rows other than the target row to a voltage potential with the same polarity as a programming signal; grounding the target column; preparing the programming signal on the target rows; sending a pulse signal enable an access transistor on the target column; and sending the programming signal to pass the first target device.

13 Claims, 11 Drawing Sheets

| Name | T Min | T Max | Voltage | T Rising |
|---|---|---|---|---|
| Fast pulse | 168 ns | 4.5 us | +/- 3.5V | 10 ns |
| Mid pulse | 10 us | + inf | +/- 10V | 100 ns |
| Slow pulse | 5 ms | + inf | +/- 10V | 10 us |

CROSSBAR ARRAY WITH REDUCED DISTURBANCE

CROSS-REFERENCE TO RELATED APPLICATIONS

This application is a divisional application of U.S. patent application Ser. No. 15/999,140, filed on Aug. 17, 2018, issued as U.S. Pat. No. 11,538,523, which is hereby incorporated by reference in its entirety.

TECHNICAL FIELD

The present disclosure generally to crossbar array circuits and more specifically relates to crossbar array circuits with reduced disturbance.

BACKGROUND

A crossbar array circuit may include multiple horizontal row metal wires and vertical column metal wires or electrodes intersecting with each other, with cross-point devices formed at the intersecting points. Crossbar arrays have a number of applications, including in non-volatile solid-state memory, computing, signal processing, control systems, and high-speed image processing.

Technical challenges, for example, reducing such signal disturbances as static sneak current and dynamic sneak current, remain.

SUMMARY

An apparatus, which comprises: a plurality of rows; a plurality of first columns; a plurality of second columns, a plurality of devices, wherein each of the plurality of devices is connected among one of the plurality of rows, one of the plurality of first columns, and one of the plurality of second columns; and a shared end on the plurality of first columns or the plurality of the second columns connecting to the plurality of the devices in the same row or column, wherein the shared end is grounding or holds a stable voltage potential.

In some implementations, one of the plurality of devices comprises: a memristor, a memristive, a Pulse-Code Modulation (PCM) device, a floating gate, a phase change device, a Resistive Random-Access Memory (RRAM or ReRAM), a Magnetoresistive Random-Access Memory (MRAM), a Dynamic random-access memory (DRAM), a Static Random-Access Memory (static RAM or SRAM), or other devices with tunable resistance.

In some implementations, the stable voltage potential is a constant DC voltage.

In some implementations, one of the plurality of devices comprises: a first RRAM connected to one of the plurality of rows; and a first access transistor serially connected to the first RRAM. The first access transistor is connected between one of the plurality of first columns and one of the plurality of second columns.

In some implementations, the apparatus further comprises: a signal generator; a decoder connected to the signal generator, a signal output connected to the plurality of second columns, and a pulse generator. The plurality of rows are connected to the decoder; a plurality of first columns are connected to the pulse generator.

A method of programming a circuit with reduced signal disturbances comprising: selecting a first target device as identified by a target row in a plurality of row's and a target column in a plurality of columns; selecting the target row: floating the plurality of rows other than the target row, grounding the target column; preparing a programming signal on the target row; sending a pulse signal to enable an access transistor on the target column; and sending the programming signal to pass the first target device.

In some implementations, the method further comprises: selecting a second target device after sending a pulse signal to pass the first target device.

A method of programming a circuit device with reduced disturbances comprising: selecting a first target device on a target row of a plurality of rows and a target column of a plurality of columns; selecting the target row; connecting the plurality of rows other than the target row to a voltage potential with the same polarity as a programming signal; grounding the target column; preparing the programming signal on the target row'; sending a pulse signal to enable an access transistor on the target column; and sending the programming signal to pass the first target device.

In some implementations, the voltage potential is substantially the same as the programming signal.

In some implementations, the method further comprises: selecting a second target device after sending a pulse signal to pass the first target device.

BRIEF DESCRIPTION OF THE DRAWINGS

FIG. 10 is a data table illustrating example experimental data used to test and reduce disturbance in a crossbar array in accordance with some implementations.

The implementations disclosed herein are illustrated by way of example, and not by way of limitation, in the figures of the accompanying drawings. Like reference numerals refer to corresponding parts throughout the drawings.

DETAILED DESCRIPTION

The disclosed programming circuit design for crossbar array may reduce or minimize signal disturbance for at least the following reasons. First, programming signals are not released gradually; instead, the programming signals, when being prepared, are isolated from the crossbar array and devices within and released into the crossbar array after they are fully prepared. Second, a target column is fully grounded to reduce dynamic sneak current. Third, a predetermined voltage potential may be provided on devices within a same column to further reduce sneak current caused by limited or finite wire resistance, which cause different devices to have different non-zero voltage potential even the target column is fully grounded.

Figure 1:
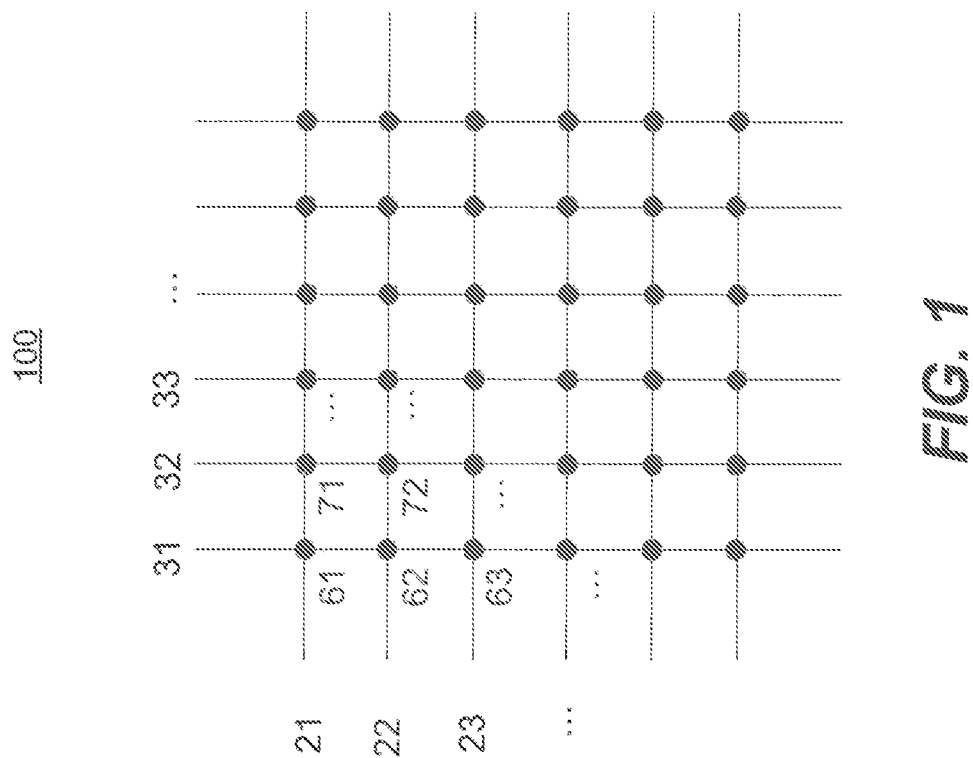
FIG. 1 illustrates an example crossbar array circuit in accordance with some implementations.

FIG. 1 shows an example crossbar array circuit 100. As shown in FIG. 1, the crossbar array circuit 100 may be a circuit structure that has one or more horizontal row wires (e.g., 21, 22, 23, etc. and one or more vertical column wires 31, 32, 33, etc. The horizontal row wires and the vertical column wires may intersect with each other, with cross-point devices 61, 62, 63, 71, 72, etc. formed at the intersecting points (also referred to as intersections). The conductance of the cross-point device may be tuned by applying a large enough voltage/current signal across it. In some implementations, a cross-point device may be a RRAM, a floating gate device including flash, a phase change device including PC-RAM (phase-change memory), or an SRAM (static random-access memory). In some implementations, the wires are metal wires.

Also, a crossbar array circuit can be used for parallel weighted current summation. By applying input signal at horizontal rows of the crossbar, the input signal V are weighted at each cross-point device by its conductance G through Ohm's law, and weighted current is accumulated per column wares through Kirchhoff's Current Law. In some implementations, in a RRAM crossbar, I equals to V times G, e.g., I=VG.

Crossbar's physical weighted current summation feature I=VG allows a crossbar to be used for vector-matrix multiplication Y=XA, where X represents an input row vector, A represents a matrix, and Y represents an output row vector. To perform a vector-matrix multiplication, first, a mapping between physical parameters to mathematical variables is needed. The matrix A may contain both positive and negative values, but device conductance G can only be positive. There are different ways to solve the technical program of mapping I VG to Y=XA.

In a first example method, input data vector X is converted to row input signal vector V by: V=c*X, where c is a scalar.

In some implementation, Matrix A may be converted to cross-point conductance G in the following way: employing one or more devices and using their difference to present the positive/negative value of A, such that:

$$Y==XA=V/c(a*G_{odd}-a*G_{even}).$$

$G_{odd}$ and $G_{even}$ represent the conductance matrices of the pairs of devices. In one embodiment, the pair of devices where one is on the odd row, and the other is on the even row are used; additional hardware may be needed to provide the complementary input—Vi, where Vi is the i-th entry of input voltage vector V to generate Vi*(gi, odd–gi, even). In another embodiment, when the pair of the device where one is on the odd column, and the other is on the even column are used, a differential amplifier may be used to sense and subtract the currents.

In a second example method, input data vector X may be converted to row input signal vector V by: V=c*X, where c is a scalar. Matrix A may be shifted to all positive by a large enough scalar b, so that A+b is positive and every entry of A+b may be mapped to a single device, so that G=aA+b, both a and b are scalars.

Since I=VG=c*X*(aA+b)=a*c*XA+c*X*b*J=a*c*XA+c*b*sum(X), where J is an all-ones matrix, means every entry of J is 1, Y may be derived as follows:

$$Y=(I-c*b*\text{sum}(X))/(a*c)$$

Compared with the first example method, the second example method uses only one device per matrix entry and does not need additional input signal or a differential amplifier. On the contrary, the first example method may not need an additional digital summation operation for every input data X.

Moreover, in some embodiments of the present disclosure, as input data can be easily converted to input signal through DAC or time/frequency encoding, a programming method maybe used to tune every cross-point device to their target state G efficiently and with less disturbance.

To enable accurate tuning of a cross-point device, a 1-Transistor-1-Resistor (1T1R) cell structure may be used as the cross-point device. The transistor is serially attached to a RRAM and may perform the function of a switch for controlling the currents flowing through the resistor and suppressing sneak currents within the crossbar. For floating gate implementations, a second transistor may not be needed, because the conductance of the floating gate may be tuned by charging different amount of charges at the gate.

In the implementations that include a 1T1R structure, a RRAM may be a two-terminal non-volatile memory device based on resistance switching effects. An example device may include a RRAM, an STT-MRAM, a ReRAM, or any cross-point device with tunable resistance. In some implementations, a transistor may be a semiconductor device configured to amplify or switch electronic signals and electrical power on and off. A transistor may have at least three terminals for connecting to an external circuit. A transistor in the embodiments of the present disclosure includes a Bipolar Junction Transistor (BJT), a Field-Effect Transistor (FET), a High Electron Mobility Transistor (HEMT), a TaOx device, a TiOx device, a HfOx device, a FeOx device, and any devices with different switching material.

Figure 2:
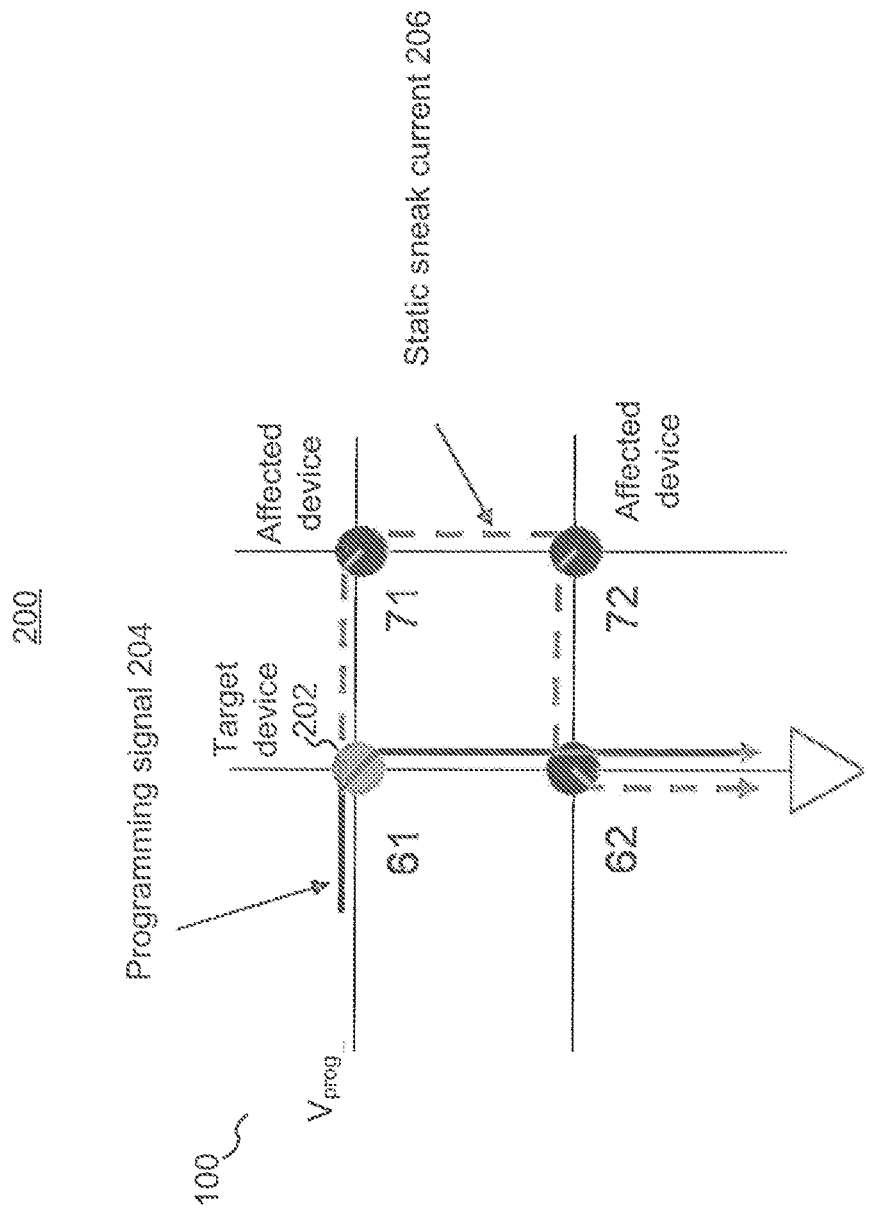
FIG. 2 illustrates an intersection within a crossbar array and how[7] static sneak current may affect other devices located in the crossbar array.

FIG. 2 illustrates an intersection 200 within a crossbar array and how static sneak current may affect other devices located in the crossbar array 200. As shown in FIG. 2, the target device 61 is located at the intersection of the first row and the first column of the crossbar. A $V_{prog}$ may be applied on one side of the first row and the other side of the first row may be grounded or connected to a voltage lower than $V_{prog}$, or vice versa, creating a voltage difference across the target device 202. Flowing the programming current 204 through the target device 202 may change the state of the target device 202. As shown in FIG. 2, however, a static sneak current 206 may pass through affected devices 71, 72 and 62, resulting in the changes of states of the affected devices 71, 72 and 62. The disturbances caused by the static sneak current 206 may thus cause the affected devices to be accidentally programmed.

Figure 3:
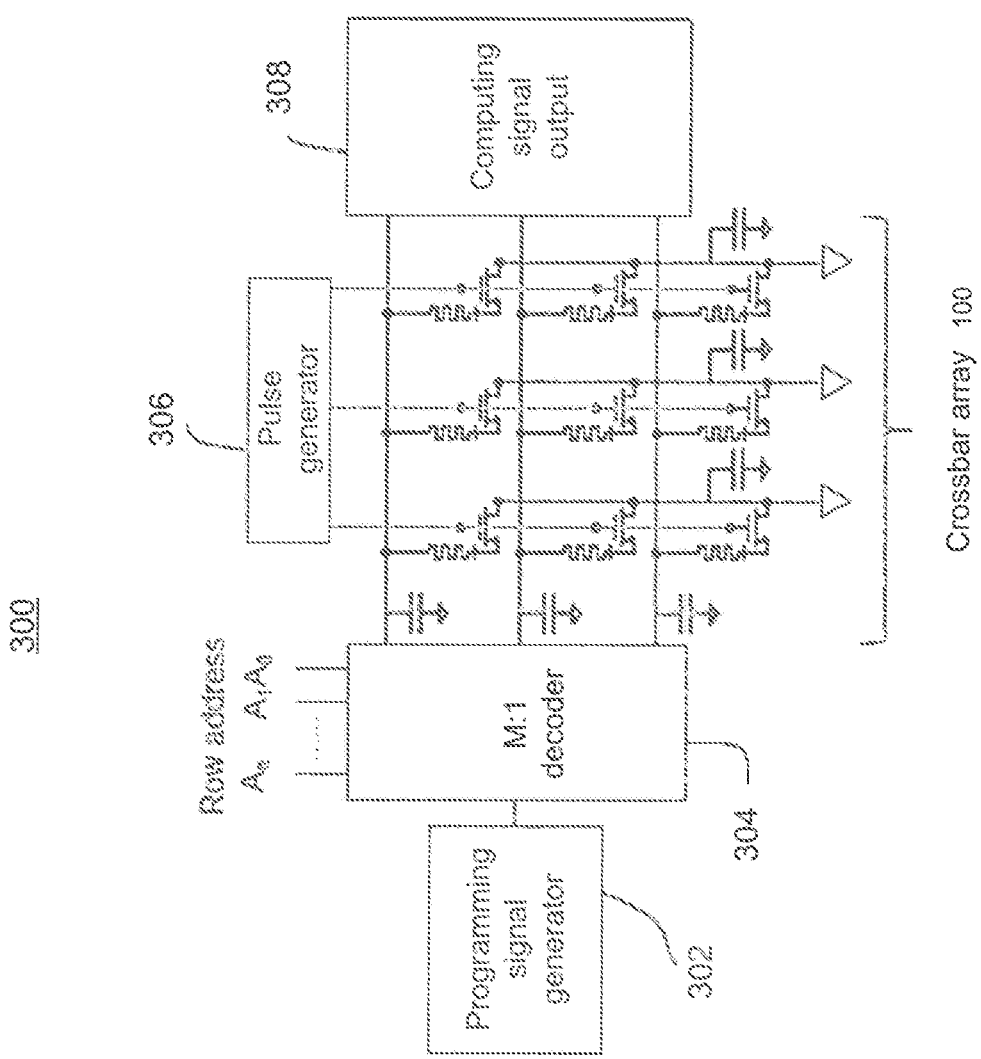
FIG. 3 illustrates an example programming circuit diagram including a crossbar array in accordance with some implementations.

FIG. 3 illustrates an example programming circuit 300 in accordance with some implementations. As shown in FIG. 3, the programming circuit 300 includes a signal generator 302, a decoder 304, the crossbar array 100, a pulse generator 306, and a signal output 308.

The signal generator 302 may be a digital-to-analog converter (DAC), a pulse generator, a spiking neuron circuit, a ramping signal generator, or any circuit that may be configured to generate a voltage/current signal strong enough to program the states of a RRAM. The signal generator 101 may be used to generate programming signals, which may be provided to the crossbar array 100 and devices located within the crossbar array 100.

In one embodiment, the decoder 304 is an M-to-1 decoder for row selection. In some embodiments, un-selected rows are floating with pre-discharged to grounding; in some other embodiments, to further reduce disturbance, un-selected rows may be floating but pre-charged to one or more predetermined signals with the same polarity of the programming signal, so that the remaining charge at one side of the access transistor could counter the dynamic sneak current when the transistor is turned on. This differs from connecting un-selected rows to sources, in which case current paths may form. This feature is discussed with at least reference to FIG. 9.

Figure 4:
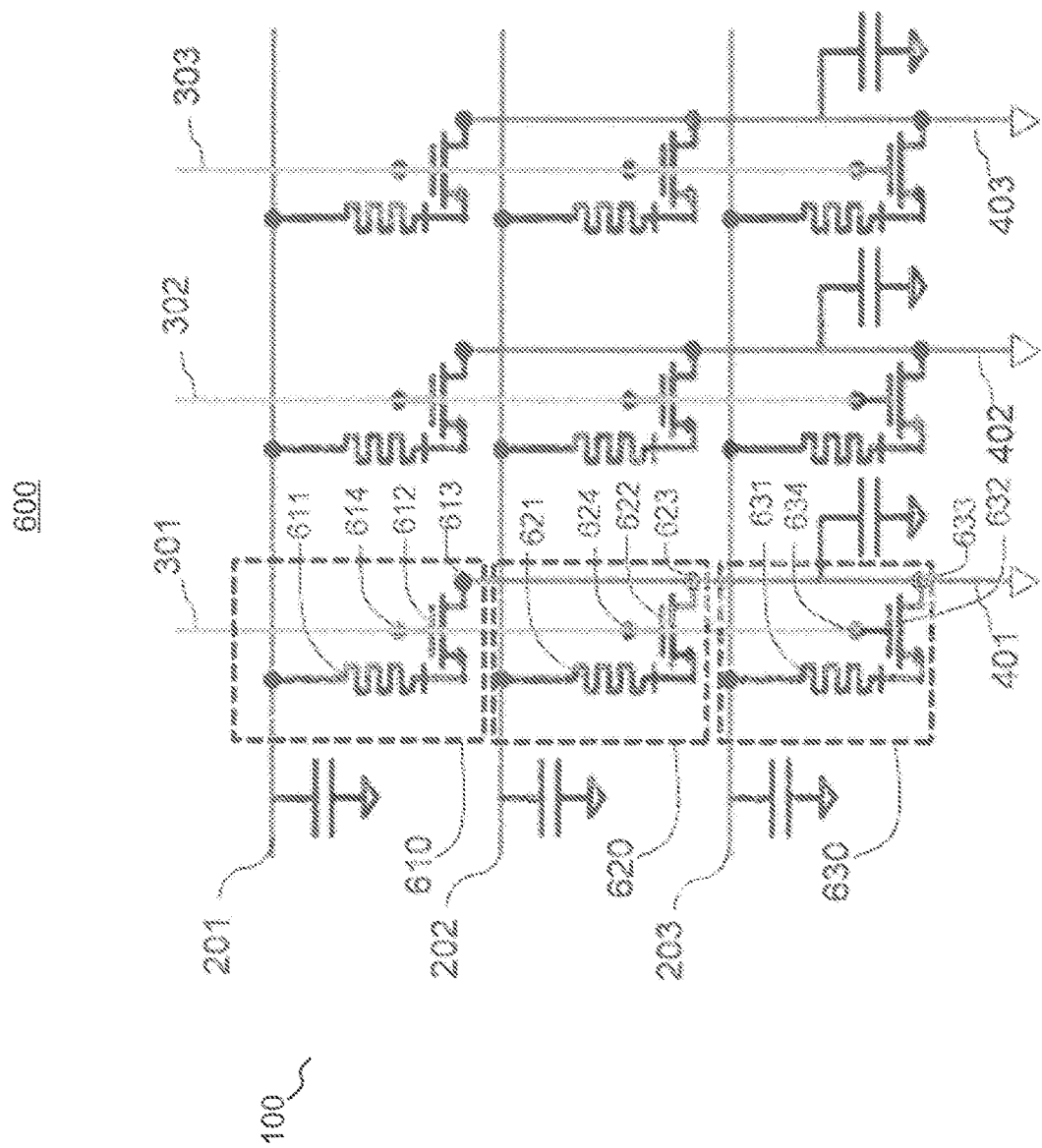
FIG. 4 is an enlarged view of a crossbar array in accordance with some implementations.

FIG. 4 illustrates an enlarged view 600 of the crossbar array 100 in accordance with some implementations of the present disclosure. As shown in FIG. 4, the crossbar array 100 includes a plurality of rows such as rows 201, 202, and 203, a plurality of first columns such as first columns 301, 302, and 303, a plurality of second columns such as second columns 401, 402, and 403, a plurality of devices such as devices 610, 620, and 630.

Each of the plurality of devices, e.g., the device 610, the device 620, and the device 630, is connected among one of the plurality of rows, one of the plurality of first columns, and one of the plurality of second columns. Shared end such as shared ends 613, 623, 633 on the plurality of the second columns or shared ends 614, 624, 634 on the plurality of first columns connecting to the plurality of the devices in the same row or column. A shared end may be grounded or hold a predetermined voltage potential.

Also, as shown in FIG. 4, the rows 201, 202, and 203 connect directly or indirectly to the decoder 304. The first columns 301, 302, and 303 connect directly or indirectly the pulse generator 306. The first device 610 on row 201 includes a first RRAM 611 and a first access transistor 612 serially connected to the first RRAM 611; the second device 620 on row 202 includes a second RRAM 621 and a second access transistor 622 serially connected to the first RRAM 621; the third devices 630 on row 203 includes a third RRAM: 631 and a third access transistor 632 serially connected to the first RRAM 631; each of the access transistors in the same column is connected to the second column 401 via one end (such as a gate end) and the first column 301 via the end (such as a drain end).

In one embodiment of the present disclosure, each device is programmable to have one of a plurality of distinguishable resistance or levels.

In one embodiment of the present disclosure, the access transistor is a transistor that enables or switches the accessibility of the devices to be programmed. With the access transistors in FIG. 4, first, the adjacent rows or columns may be regarded as independent; as such, static sneak current in a 1T1R crossbar array may be reduced or eliminated when programming. Second, the access transistor performs as a voltage divider when applying a different level of access voltage on its gate (through the access control line). For RRAM that is more voltage-controlled, this design enables a more granular control. Third, the access transistor also performs as the current compiler with different levels of access voltage on its gate. For RRAM that is more current-controlled, this design also enables a more granular control. The access transistor may enable analog fine tune of the crossbar array devices or devices with one or more passive arrays.

In one embodiment of the present disclosure, the programming circuit 100 may operate in a parallel mode. The pulse generator 300 may select and send a pulse to multiple access transistor control lines simultaneously so that multiple target devices can be programmed in parallel. However, as more devices are programmed in parallel, more sneak current may likely result in the crossbar due to correlated columns and rows. Therefore, the level of parallelization needs to be controlled to reduce sneak current and its resulting disturbance.

Before or when programming, the drain ends of the target devices may be grounded to prevent or reduce charge being accumulated on the shared end of the second columns 401, 402, 403, etc. while the column in which the target devices are located are grounded, the remaining columns may be left floating or also be grounded.

When programming, the M: 1 decoder 304 selects the row of the target device such as the third device 630, and the programming signal is applied to the selected row[7] 203. In some implementations, after the programming signal is not released into the crossbar array 100 and applied to the selected row 203—unless and until the programming signal is fully prepared (e.g., becomes and remains stable). These technologies may further reduce dynamic sneak current, in addition to grounding the share ends of the target devices.

The pulse generator 306, in some implementations, selects an access transistor such as the third access transistor 632 control for the column of the target device 630. A pulse may be sent to the third access transistor 632 so that third access transistor 632 of the target device 630 is turned on for duration of the pulse, enabling the target device 630 to be programmed, by passing a voltage/current spike to through the target device 630. Since other access transistors are not turn on during the period, the static sneak current and the dynamic sneak current are reduced or eliminated; so is the programming disturbance.

The above-explained technologies may not completely eliminate the disturbance, however, in some implementations. For example, when a RRAM is sensitive to voltage/current spike. Also, dynamic sneak current may, although significantly reduced, still result when the size of the crossbar array exceeds a predefined value, for example, 2000× 2000.

Figure 5A:
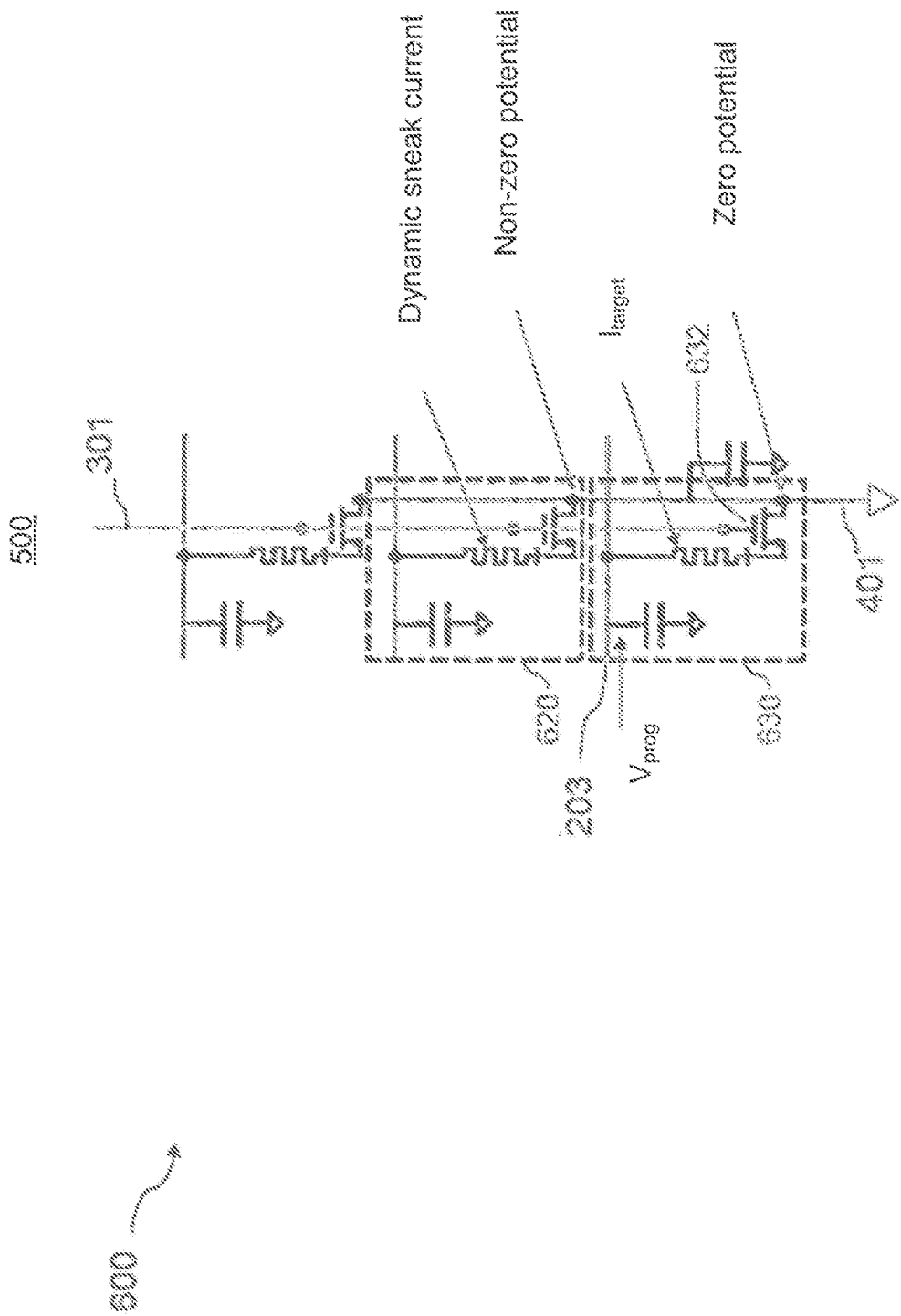
FIGS. 5A and 5B are block diagrams illustrating exemplary methods for reducing dynamic sneak current in a crossbar array in accordance with some implementations of the present disclosure.
Figure 5B:
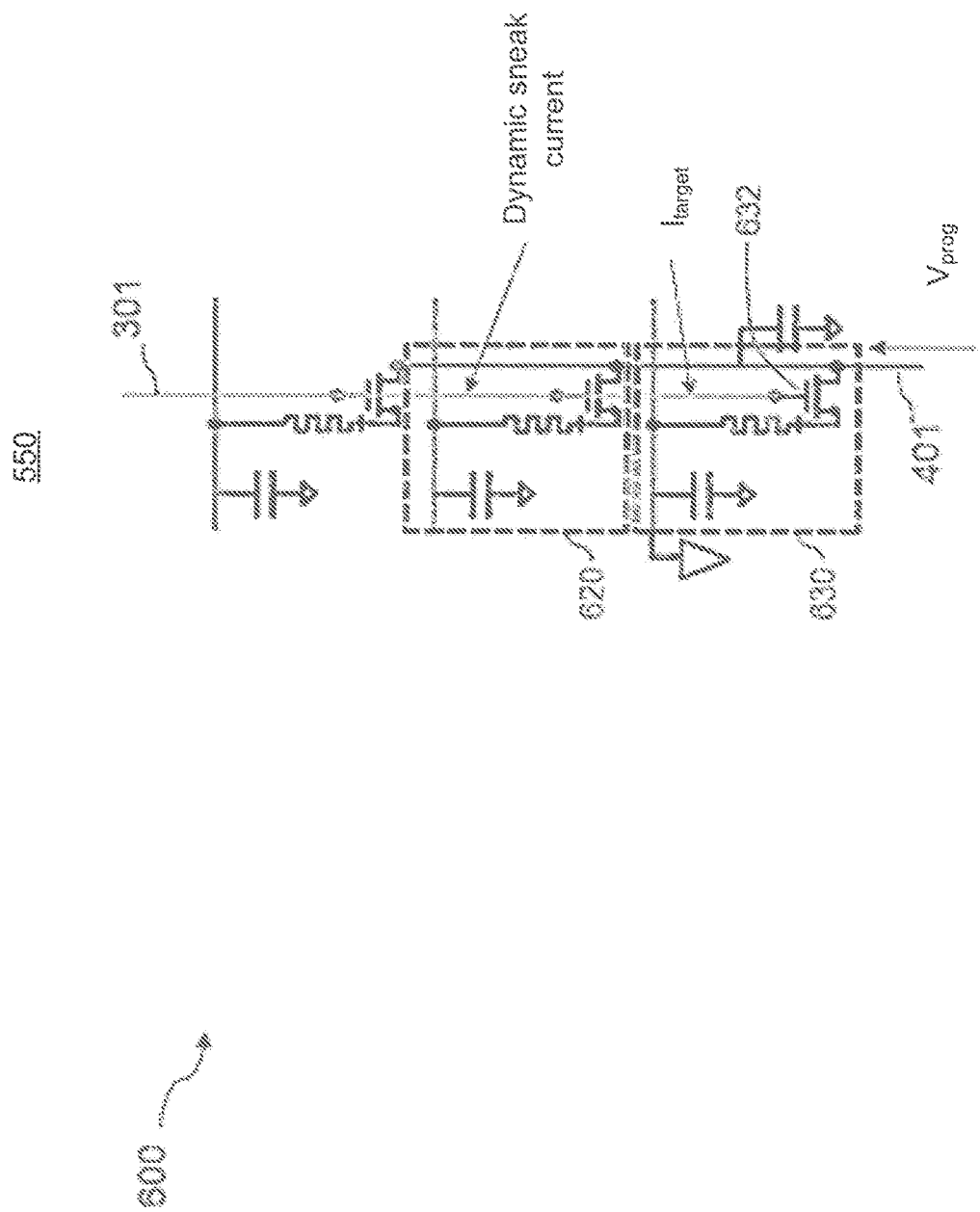

FIGS. 5A and 5B are block diagrams illustrating example methods for reducing dynamic sneak current in a crossbar array in accordance with some implementations of the present disclosure.

As shown in FIG. 5A, a programming signal $V_{prog}$ is sent through the selected row from the row 203. When the third access transistor 632 is enabled, the programming current flows through target device 630 to the ground of the column 301, modifying the state of the target device 630.

Due to limited wire resistance, however, the device such as the second device 620 which is far from the grounding side of the column may have non-zero potential on its shared end of the bottom column 401. The voltage potential of the shared end has the same polarity of the programming signal and increases as it is farther from the grounding point. Since access transistors are shared per column, there may therefore be dynamic sneak currents passing through affected devices (also referred to as non-targeted devices), such as the second device 620. The dynamic sneak current may program the affected devices and thus cause unwanted programming results.

As shown in FIG. 5B, a programming signal $V_{prog}$ is sent through the selected row from the bottom column 401. When the third access transistor 632 is enabled, the programming current flows through target device 630 to the ground of the column, modifying the state of the target device 630. Similarly, due to limited wire resistance, however, devices that are far from the grounding side of the column, for example the second device 620, may also have a non-zero potential on their shared ends of the first column 301. The voltage potential of the shared end has the same polarity of the programming signal and increases as it is farther from the grounding point. Since access transistors are shared per column, there may therefore be dynamic sneak current passing through affected devices (or non-targeted devices), e.g., the second device 620. The dynamic sneak current may program the affected devices and thus cause an unwanted result.

Although the level of this dynamic sneak current is orders of magnitude lower than that without the basic non-disturbing programming scheme, the resulting disturbance may become noticeable when the size of a crossbar array exceeds a predetermined value (e.g., 2000×2000) or when the resistance of the wires exceeds a predetermined amount. The performance of the crossbar array may suffer due to the resulting disturbance.

Figure 6:
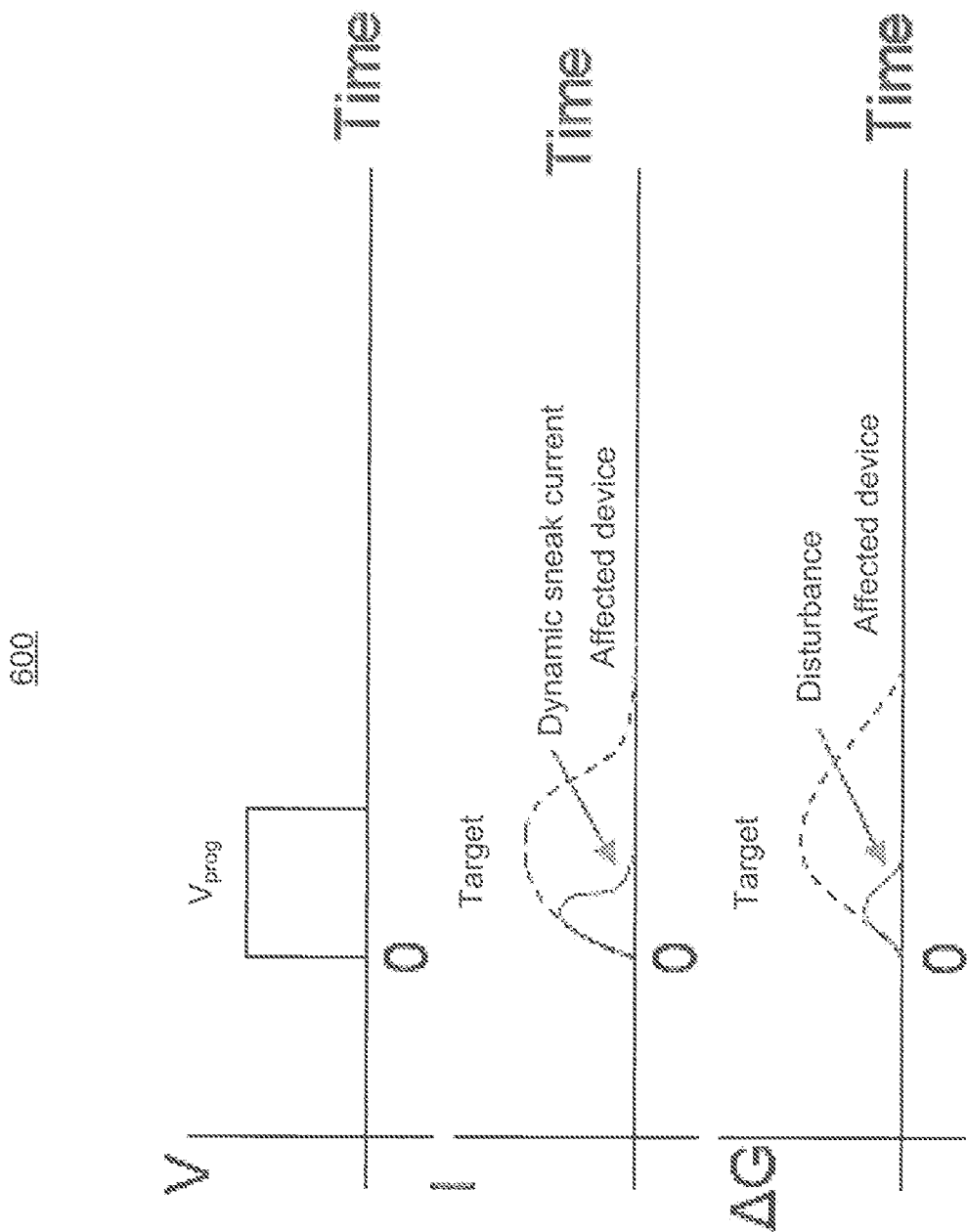
FIG. 6 illustrates the dynamic sneak current on other affected devices in the same crossbar array during the operation as in FIGS. 5A and 5B.

FIG. 6 illustrates the dynamic sneak current passing through affected devices in the same crossbar array during the operation period explained in FIGS. 5A and 5B.

As shown in FIG. 6, when $V_{prog}$ is sent, due to low' capacitance, a current spike may occur due to a sudden change of voltage on the column and may modify the states of affected devices. The current spike may be deemed a dynamic sneak current, because it disappears when the floating end of affected device is fully charged to $V_{prog}$. The voltage at the floating end Vin) may be calculated as follows:

$$V_{f(t)} = V_{prog}(1 - \exp(-t/RC))$$

where R is the total resistance from the shared column end to the floating end, dominated by the resistance of RRAM and access transistor.

The dynamic sneak current $I_d$ may be calculated as follows:

$$I_{d(t)} = (V_{prog(t)} - V_{f(t)})/R = V_{prog(t)} * \exp(-t/RC)/R$$

As shown above, it can be seen that $I_{d(t)}$ may depend on three factors: R, C, and $V_{prog(t)}$, where only $V_{prog(t)}$ is modifiable after the circuit is fabricated. When $V_{prog(t)}$ is a square pulse, the rising time and amplitude may have a significant impact on the dynamic sneak current.

Figure 7:
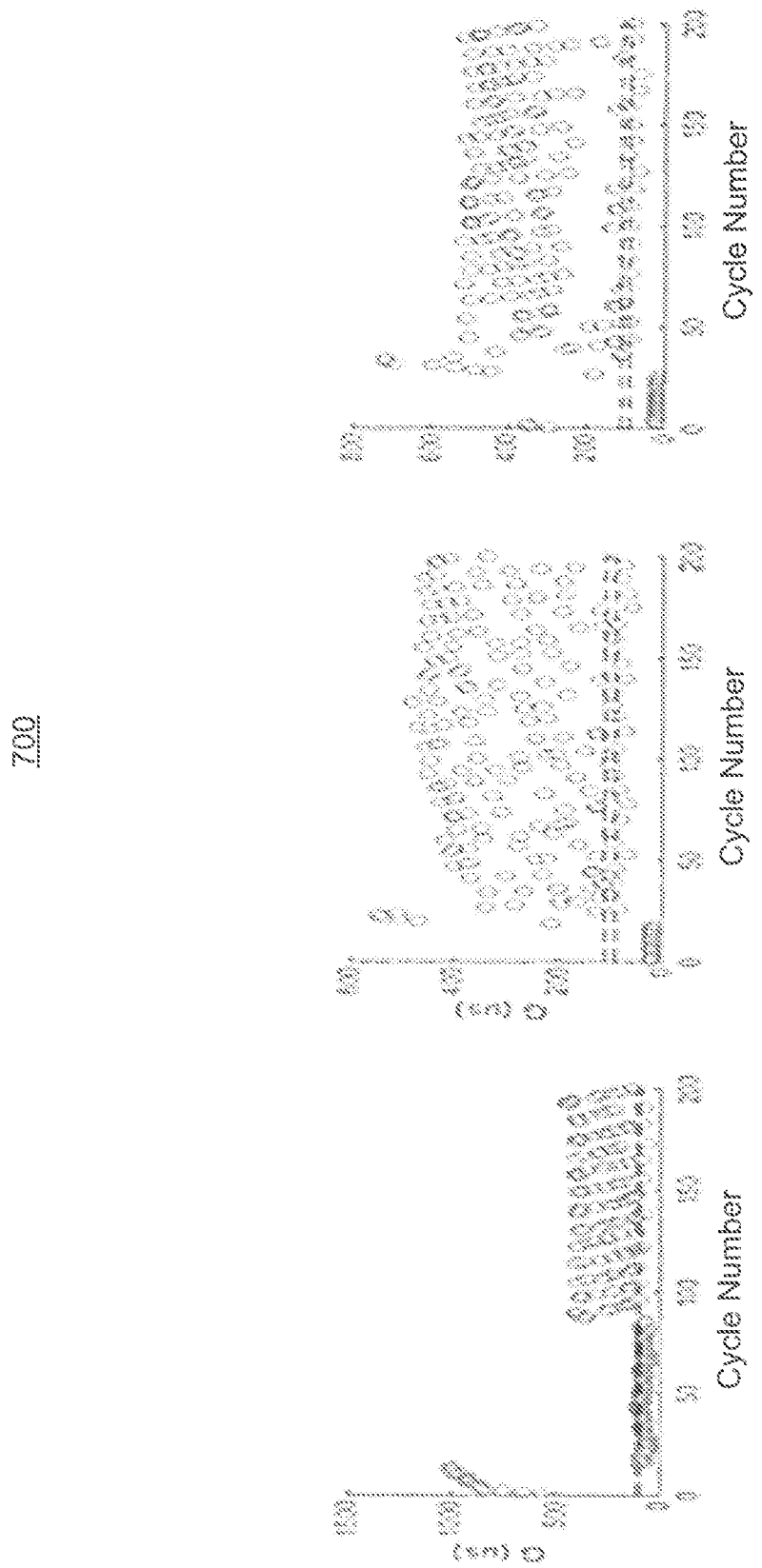
FIG. 7 illustrates example disturbance that may occur in a 1T1R crossbar array due to dynamic sneak current in accordance with some implementations.

FIG. 7 illustrates example disturbance 700 detected in a 1T1R crossbar array due to dynamic sneak current by a supplementary reference.

Figure 8:
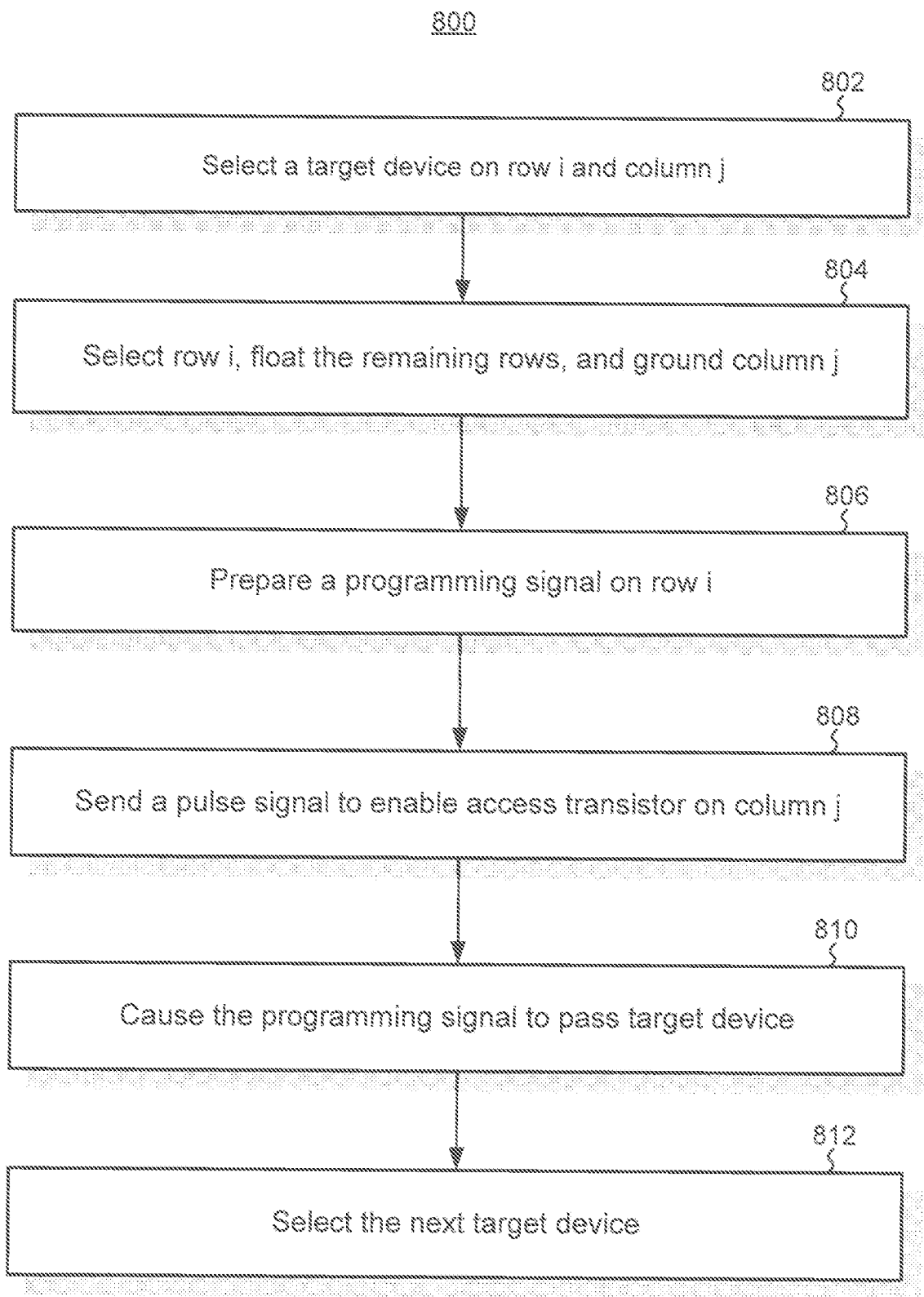
FIG. 8 is a flowchart illustrating a first example programming method for programing a crossbar array in accordance with one embodiment of the present disclosure.

FIG. 8 is a flowchart 800 illustrating an example method 800 for programming a crossbar array in accordance with one embodiment of the present disclosure.

As shown in FIG. 8, at step 802, a decoder selects a first target device on a target row i and a target column j such as the third device 630 on row 3 and column 1.

At step 804, when the decoder 200 selects, in accordance with an incoming programming signal, a target row i and a target column j. Row's other than the target row i are considered un-selected and may be floating; and the target column j may be grounded. It is noted that while the column of the target device is grounded to reduce disturbance, the un-selected columns may either be grounded or left floating.

At step 806, the programming signal becomes fully prepared (or ready) and is released onto the target row i. In one embodiment, the programming signal is deemed fully prepared when the programming signal becomes stable on the selected row'.

At step 808, the pulse generator 300 selects a target access transistor of the target device, for example, the third access transistor 632, control for the column of the target device 630. A pulse may be sent to the target access transistor so that the target access transistor for the target device may be turned on for the duration of the pulse and enable a voltage/current spike passing through the target device in order to program the same.

At step 810, the programming signal is caused to pass through the on-state target device and be becomes part of the signal output 308.

At step 812, the decoder 304 may select a second target device and repeat the method 800 for the second target device.

Figure 9:
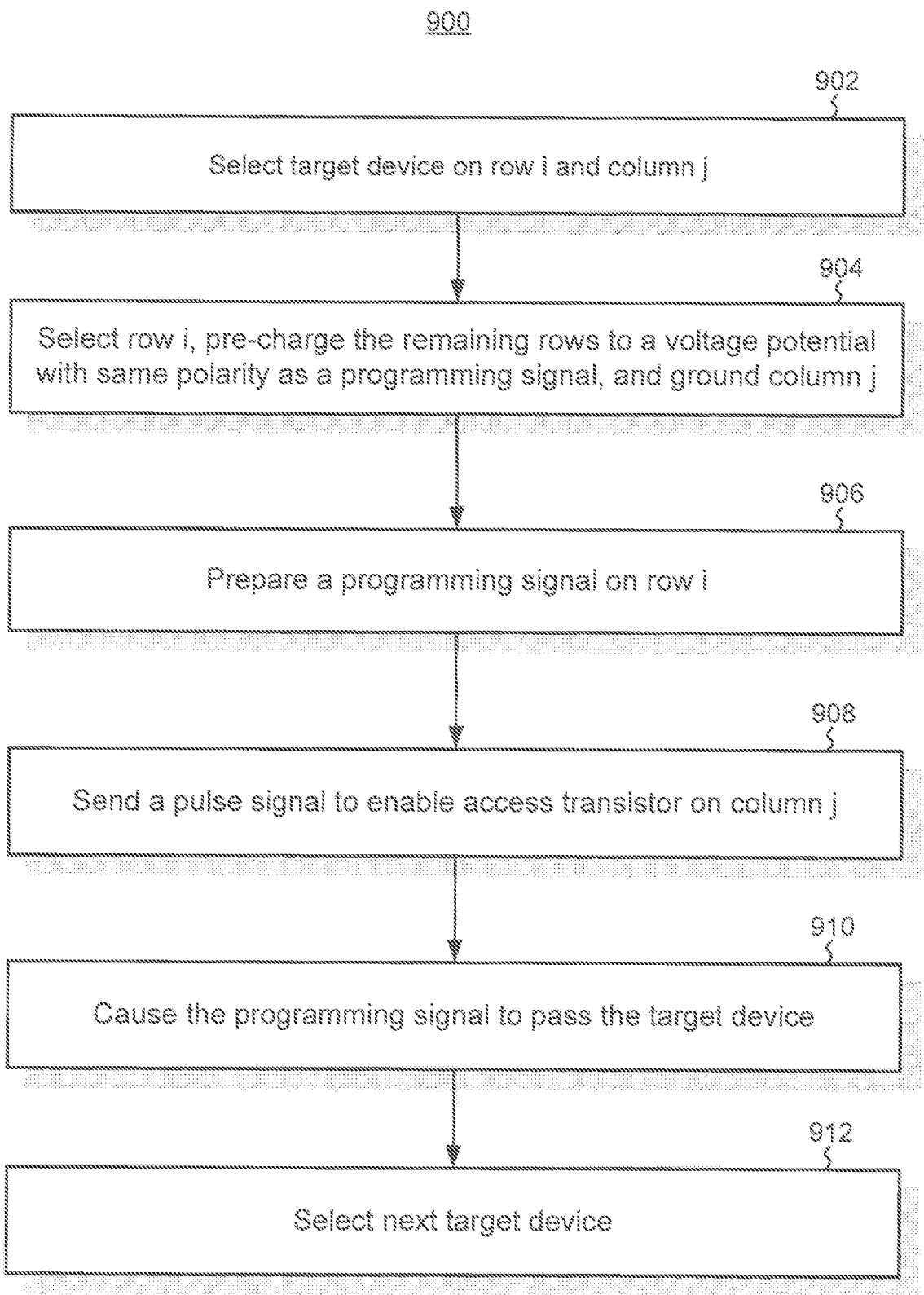
FIG. 9 is a flowchart illustrating a second example programming method for programing a crossbar array in accordance with one embodiment of the present disclosure.

FIG. 9 is a flowchart 900 illustrating a second example programming method 900 for programming a crossbar array in accordance with one embodiment of the present disclosure.

As shown in FIG. 9, at step 902, the decoder 200 shall choose a first target device on a target row i and a target column j such as the third device 630 on row' 3 and column 1.

At step 904, when a decoder (e.g., the decoder 304) selects a target row i and a target column j. The un-selected rows (e.g., all rows except the target row i) may be floating, but pre-charged to a predefined amount of voltage potential provided by $V_{comp}$, which shares the same polarity as $V_{prog}$ of the programming signal.

In addition to the voltage potential $V_{comp}$, the target column j may be grounded. While the column of the target device is grounded to reduce disturbance, the un-selected columns may either be grounded or left floating.

At step 906, the programming signal has become ready and is provided to the target row i. In one embodiment, the programming signal becomes ready when it becomes stable on the selected row.

Thereafter, at step 908, a pulse generator selects a target access transistor of the target device, such as the third access transistor 632, control for the column of the target device 630. A pulse is then sent to the target access transistor in order to turn on the target access transistor of the target device for the duration of the pulse and to enable a voltage/current spike passing through the target device so as to program the same.

Next, at step 910, the programming signal is caused to pass through the on-state target device and is sent to the signal outputting module 400.

At step 912, the decoder may select a next target device and repeat the method 900 on the next target device.

Example differences between the example programming method 900 (which may be referred to as an advanced programming method) and the example programming method 800 (which may be referred to as a basic programming method) may include the following aspects. First, an additional voltage source $V_{comp}$ is provided to compensate the non-zero voltage potential that may result on the shared ends shown in in FIGS. 5A and 5B. The additional voltage source $V_{comp}$ has the same polarity as programming signal $V_{prog}$, and it holds a voltage amplitude slightly higher than zero (grounding). Second, all unselected rows, or at least the unselected rows that are far away from the grounding point (e.g., rows that are away from the grounding point by a predefined number of rows), are floating but pre-charged by the additional voltage source $V_{comp}$. In these ways, when the access transistors on the same column are enabled, the non-zero potential caused by wire resistance may be compensated by pre-charged voltage potential provided by $V_{comp}$. further reducing the dynamic sneak current.

In one embodiment of the present disclosure, the compensating voltage source $V_{comp}$ is set to a constant DC voltage for low-cost implementation, the amplitude of DC voltage is calculated based on the estimation of non-zero potential on the shared end. In another embodiment, a more complex hardware may be used to generate a voltage that is substantially the same as the voltage potential on the shared end. It is noted that, in some implementations, "substantially the same" means that the voltage difference has a tolerance of ±0.5V or that the voltage difference is small enough to avoid disturbance in devices. In some implementations, the voltage difference is a voltage that is capable of causing a state change on a device even during a read operation, depending on the behavior of the device.

It should be noted that the descriptions of the method 800 and 900 are made with reference to the features depicted in FIGS. 3-5 for purposes of illustration and thus, the methods 800 and 900 may be implemented in ways having architectures different from those shown in those figures.

In the embodiments of the present disclosure, due to the sneak current spike through the non-target transistors, programming disturbance still happen in 1T1R crossbar array if not carefully addressed. Therefore, a slow rising pulse method is applied to minimize the disturbance. In one embodiment, the disturbance is reduced when the rising time of the ±10 voltage pulse is higher than 10 us.

In some of the implementations discussed above, the shared ends are located on the columns, because the access transistor control is shared by column. In some other implementations of the present disclosure, the access transistor control is shared by row; as a result, the shared ends are the rows and the systems and methods discussed above may be modified accordingly in order to achieve similar technical results.

FIG. 10 is a data table illustrating example experimental data used to test and reduce disturbance in a crossbar array in accordance with some implementations.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation (s).

It will also be understood that, although the terms "first," "second," etc. may be used herein to describe various elements, these elements should not be limited by these terms. These terras are only used to distinguish one element from another. For example, a first column could be termed a second column, and, similarly, a second column could be termed a first column, without changing the meaning of the description, so long as all occurrences of the "first column" are renamed consistently and all occurrences of the "second column" are renamed consistently. The first column and the second are column both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. A method of programming a circuit device with reduced disturbances comprising:
    selecting a first target device from a plurality of devices in a crossbar array, wherein the first target device is connected to a target row of a plurality of rows and a target column of a plurality of columns in the crossbar array;
    selecting the target row;
    pre-charging one or more unselected rows of the plurality of rows to a voltage potential with the same polarity as a programming signal;
    grounding the target column;
    preparing the programming signal on the target row until the programming signal becomes stable on the target row;
    sending a pulse signal to enable an access transistor on the target column; and
    causing the prepared programming signal to pass through the first target device.

2. The method as claimed in claim 1, wherein the voltage potential is substantially the same as the programming signal.

3. The method as claimed in claim 1, further comprising: choosing a second target device of the plurality of devices after sending a pulse signal to pass the first target device.

4. The method as claimed in claim 1, wherein each of the plurality of devices comprises a device with tunable resistance.

5. The method as claimed in claim 4, wherein the device with tunable resistance comprises at least one of a memristor, a floating gate, a phase change device, a Resistive Random-Access Memory (RRAM or ReRam), a Magnetoresistive Random-Access Memory (MRAM), a Dynamic random-access memory (DRAM), or a Static Random-Access Memory (static RAM or SRAM).

6. The method as claimed in claim 1, wherein one or more unselected columns of the plurality of columns are grounded.

7. The method as claimed in claim 1, wherein the one or more unselected columns are floating.

8. The method as claimed in claim 1, wherein the one or more unselected rows are floating.

9. The method as claimed in claim 1, wherein the one or more unselected rows are connected to a voltage source having the same polarity as the programming signal.

10. The method as claimed in claim 1, wherein the one or more unselected rows comprises a predefined number of rows of the plurality of rows.

11. The method as claimed in claim 1, wherein the target row is selected by a decoder.

12. The method as claimed in claim 11, wherein the programming signal is generated by a signal generator.

13. The method as claimed in claim 12, wherein the pulse signal is generated by a pulse generator.

* * * * *